United States Patent

(12) United States Patent
Yu et al.

(10) Patent No.: US 9,275,860 B2
(45) Date of Patent: Mar. 1, 2016

(54) METHOD OF MANUFACTURING A JUNCTION ELECTRONIC DEVICE HAVING A 2-DIMENSIONAL MATERIAL AS A CHANNEL

(71) Applicant: Electronics and Telecommunications Research Institute, Daejeon (KR)

(72) Inventors: Young Jun Yu, Daejeon (KR); Jin Soo Kim, Seoul (KR); Hong Kyw Choi, Daejeon (KR); Jin Sik Choi, Daejeon (KR); Jin Tae Kim, Daejeon (KR); Kwang Hyo Chung, Daejeon (KR); Doo Hyeb Youn, Daejeon (KR); Choon Gi Choi, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 20 days.

(21) Appl. No.: 14/258,416

(22) Filed: Apr. 22, 2014

(65) Prior Publication Data

US 2015/0228481 A1 Aug. 13, 2015

(30) Foreign Application Priority Data

Feb. 10, 2014 (KR) ........................ 10-2014-0014679

(51) Int. Cl.
*H01L 21/00* (2006.01)
*H01L 21/02* (2006.01)
(Continued)

(52) U.S. Cl.
CPC ...... *H01L 21/02628* (2013.01); *H01L 21/0259* (2013.01); *H01L 21/02381* (2013.01); *H01L 21/02422* (2013.01); *H01L 21/02568* (2013.01); *H01L 29/24* (2013.01); *H01L 29/778* (2013.01)

(58) Field of Classification Search
CPC ..................... H01L 29/0665; H01L 21/02628; H01L 21/02381; H01L 21/02422; H01L 21/0259; H01L 21/0256; H01L 21/02; H01L 29/24; H01L 29/7788
See application file for complete search history.

(56) References Cited

U.S. PATENT DOCUMENTS 7,419,764 B2 9/2008 Park et al.
7,544,523 B2 * 6/2009 Schwind et al. ................ 438/20
(Continued)

FOREIGN PATENT DOCUMENTS

KR 10-0670835 B1 1/2007
KR 10-1328275 B1 11/2013

OTHER PUBLICATIONS

Goki Eda et al., "Photoluminescence from Chemically Exfoliated $MoS_2$," Nano Letters, vol. 11, Issue 12, pp. 5111-5116, Oct. 28, 2011.

*Primary Examiner* — Kimberly Rizkallah
*Assistant Examiner* — Alexander Belousov
(74) *Attorney, Agent, or Firm* — Rabin & Berdo, P.C.

(57) ABSTRACT

A method of manufacturing a junction electronic device having a 2-Dimensional (2D) material as a channel, includes forming a pattern portion by surface-treating a substrate so that the patterned portion has a higher surface potential than other portions of the substrate; bonding a 2D material to rthe patterned portion having the higher surface potential by spraying a liquid including 2D material flakes onto the substrate; forming a pair of first electrodes in contact with both ends of the 2D material disposed on the substrate; forming a dielectric layer on the first electrodes and the 2D material; and forming a second electrode on the dielectric layer. The 2D materials are disposed at desired positions by chemical exfoliation.

6 Claims, 2 Drawing Sheets

(51) Int. Cl.
*H01L 29/778* (2006.01)
*H01L 29/24* (2006.01)

(56) References Cited

U.S. PATENT DOCUMENTS

| | | | |
|---|---|---|---|
| 2005/0266355 A1* | 12/2005 | Matsui et al. | 430/323 |
| 2011/0020533 A1* | 1/2011 | Despont et al. | 427/8 |
| 2011/0057168 A1* | 3/2011 | Kobayashi | 257/24 |
| 2011/0143101 A1* | 6/2011 | Sandhu | 428/195.1 |
| 2011/0291068 A1* | 12/2011 | Kobayashi | 257/9 |
| 2012/0220053 A1* | 8/2012 | Lee | H01L 29/4908 436/501 |
| 2012/0241069 A1* | 9/2012 | Hofmann | C01B 31/0446 156/60 |

* cited by examiner

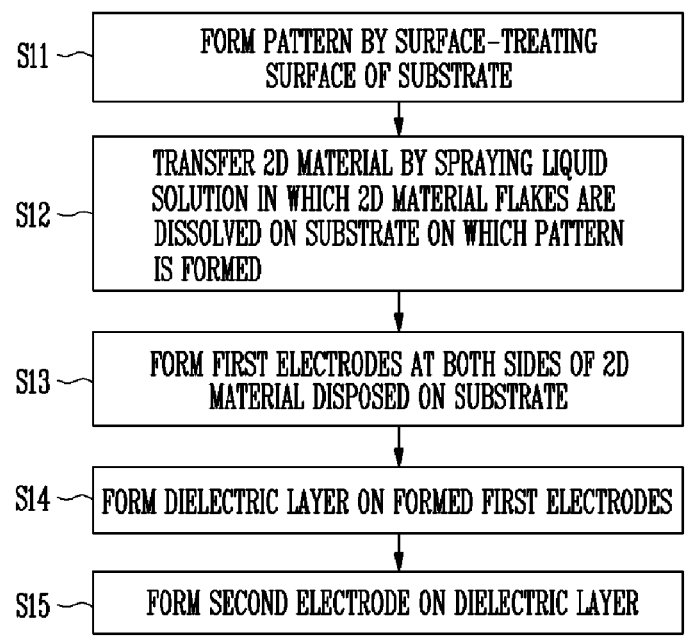
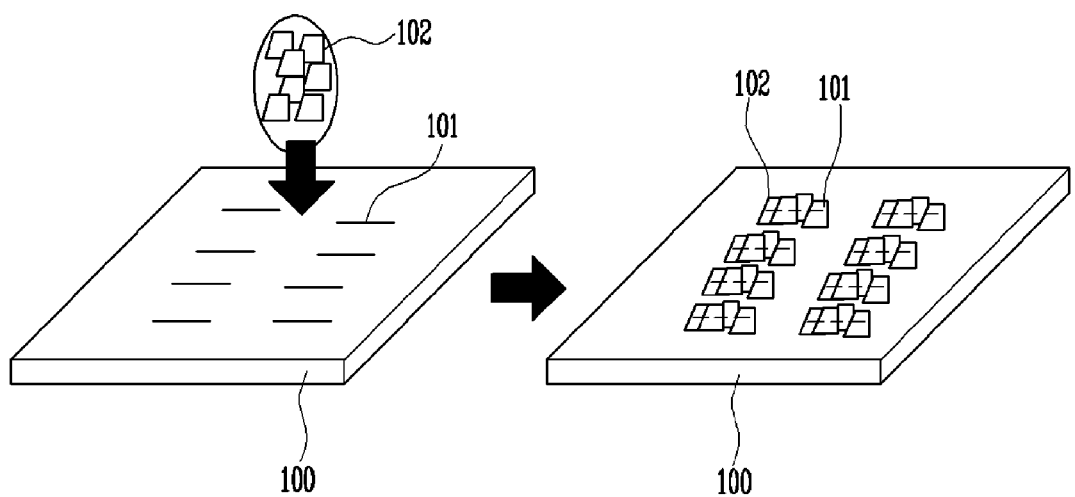

METHOD OF MANUFACTURING A JUNCTION ELECTRONIC DEVICE HAVING A 2-DIMENSIONAL MATERIAL AS A CHANNEL

CROSS-REFERENCE TO RELATED APPLICATION

This application is based on and claims priority from Korean Patent Application No. 10-2014-0014679, filed on Feb. 10, 2014, with the Korean Intellectual Property Office, the disclosure of which is incorporated herein in its entirety by reference.

BACKGROUND

1. Field

The present invention relates to a method of manufacturing a junction electronic device by disposing 2-Dimensional (2D) materials at desired positions by chemically exfoliating the 2D materials, and more particularly, to a method of manufacturing a junction electronic device by spraying flakes of a 2D material by using a liquid and transferring the 2D material to a desired position of a substrate.

2. Discussion of Related Art

Much research on a chemical (liquid) exfoliation method of dispersing a Graphene Oxide (GO) in a specific solution and transferring the dispersed GO on a desired position of a substrate has been conducted with the aim of mass production of a large area product.

That is, a simple method of directly sprinkling the solution in which desired graphene flakes are melt to a test piece and drying the solution is a method having an sufficient advantage in views of mass production, and catching up with the related art, research on a method of melting 2D materials ($MoS_2$, $WS_2$, $MoSe_2$, $WSe_2$, and the like) in a solution and spraying the 2D materials to a substrate is in a beginning stage.

However, research on chemical exfoliation of 2D materials has been recently actively conducted, but in most cases, the 2D materials are not laid on only a desired portion, but are laid on a random within an undesired thickness. Further, there is a current problem in that if there is not special coupling between the 2D material and the substrate, the 2D material is not easily attached to the substrate.

In this respect, in order to solve the problem, the present inventors express that a device may be manufactured by forming a pattern on a surface of a substrate through mechanical or chemical processing and attaching a 2D material to only a desired portion to complete the present invention.

SUMMARY

The present invention has been made in an effort to provide a method of manufacturing a junction electronic device by chemically exfoliating 2D materials and disposing the 2D materials at a desired position.

An embodiment of the present invention provides a method of manufacturing a junction electronic device using a 2-Dimensional (2D) material, including: forming a pattern by surface-treating a surface of a substrate; transferring a 2D material by spraying a liquid solution, in which 2D material flakes are dissolved, onto the substrate on which the pattern is formed; forming first electrodes at both sides of the 2D material disposed on the substrate; forming a dielectric layer on the first electrodes; and forming a second electrode on the dielectric layer.

In the method of manufacturing the junction electronic device using the 2D material, the substrate may be selected from the group consisting of a silicon substrate, a silicon oxide substrate, and a plastic substrate.

The second material may be selected from the group consisting of $MoS_2$, $WS_2$, $MoSe_2$, and $WSe_2$, and a liquid, in which ethanol and water are mixed, is selected as the liquid in which the 2D material is dissolved.

In the method of manufacturing the junction electronic device using the 2D material, the surface-treating of the substrate may include patterning a desired pattern on a sample in a nano size by using mechanical lithography using an Atomic Force Microscope (AFM), or forming polymethyl metacylate (PMMA) on the substrate, patterning the PMMA by using e-beam lithography, forming self alignment molecules (SAM) on an opened portion, and subsequently, removing the PMMA.

In the method of manufacturing the junction electronic device using the 2D material, a metal electrode or graphene may be used as the first and second electrodes, and the dielectric layer may be formed of one or more materials selected from the group consisting of $HfO_2$, $AlO_3$, and $SiO_2$.

According to the method of manufacturing a junction electronic device using a 2D material according to the present invention, a method of putting the 2D material only on a specific treated portion of the substrate by putting 2D materials of a solution on the substrate through surface treatment of the substrate and drying the solution is suggested in the current situation where a method of disposing 2D material flakes on a desired portion is not present, so that it is possible to easily manufacture a junction device based on various 2D materials by selectively disposing only the 2D material on a specific portion of the substrate.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The above and other features and advantages of the present invention will become more apparent to those of ordinary skill in the art by describing in detail embodiments thereof with reference to the attached drawings in which:

FIG. 1 is a flowchart illustrating a process of manufacturing a junction electronic device by using a 2D material according to an exemplary embodiment of the present invention;

FIG. 2 is a mimetic diagram schematically illustrating a method of transferring the 2D material by using solution processing according to the exemplary embodiment of the present invention.

DETAILED DESCRIPTION

Figure 3:
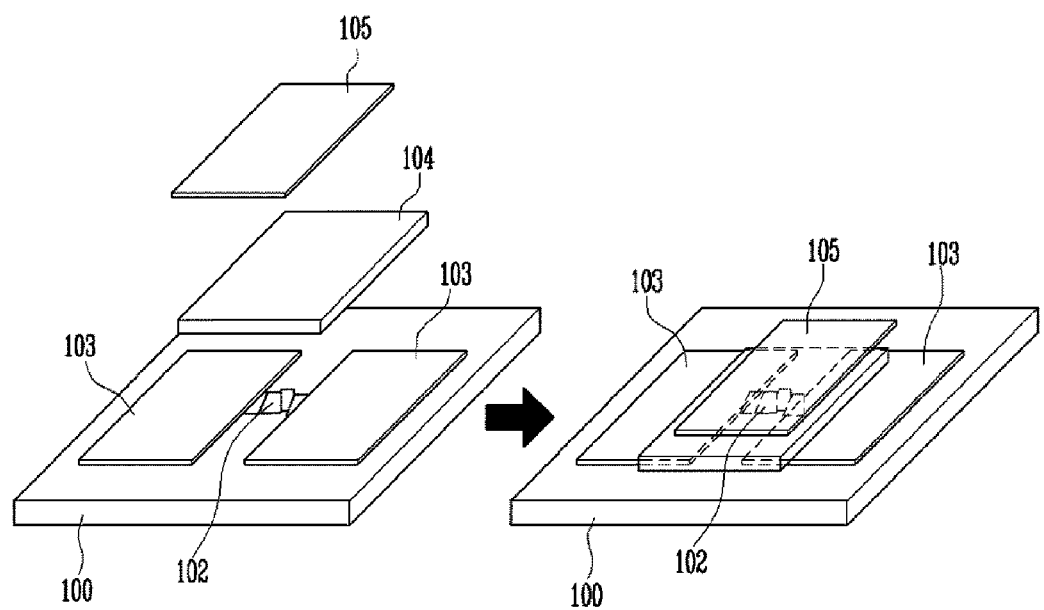
FIG. 3 is a mimetic diagram schematically illustrating the process of manufacturing the junction electronic device by using the 2D material according to the exemplary embodiment of the present invention.

Hereinafter, an embodiment of the present invention will be described with reference to the accompanying drawings in detail. However, the present invention is not limited to an embodiment disclosed below and may be implemented in various forms and the scope of the present invention is not limited to the following embodiments. Rather, the embodiment is provided to more sincerely and fully disclose the present invention and to completely transfer the spirit of the present invention to those skilled in the art to which the present invention pertains, and the scope of the present invention should be understood by the claims of the present invention.

In the drawings, thicknesses of several layers and regions are enlarged for clear expressions. Throughout the specification, similar parts are denoted by the same reference numerals. When it is described that a certain part such as a layer, a film, a region and a plate is located on another part, it means that the certain part may be located directly on the another part and a third part may be interposed therebetween as well. In contrast, when it is described that a certain part is located directly on another part, it means that there is no third part therebetween.

FIG. 1 is a flowchart illustrating a process of manufacturing a junction electronic device by using a 2D material according to an exemplary embodiment of the present invention, FIG. 2 is a mimetic diagram schematically illustrating a method of transferring the 2D material by using solution processing according to the exemplary embodiment of the present invention, and FIG. 3 is a mimetic diagram schematically illustrating the process of manufacturing the junction electronic device by using the 2D material according to the exemplary embodiment of the present invention.

Referring to FIGS. 1 to 3, a method of manufacturing a junction electronic device by using a 2D material according to the present invention includes: step S11 of forming a pattern 101 by surface-treating a surface of the substrate 100; step S12 of transferring a 2D material 102 by spraying a liquid solution, in which 2D material flakes 102 are dissolved, on the substrate 100, on which the pattern 101 is formed; step S13 of forming first electrodes 103 at both sides of the 2D material disposed on the substrate 100; step S14 of forming a dielectric layer 104 on the formed first electrodes 103; and step S15 of forming a second electrode 105 on the dielectric layer 104.

In step S11 of forming the pattern 101 by surface-treating the surface of the substrate 100, the substrate 100 may be selected from the group consisting of a silicon substrate, a silicon oxide substrate, and a plastic (for example, PET) substrate, but is not limited thereto.

The surface-treating method includes two methods. The first method is a method of patterning a desired pattern at a desired position of a substrate with a nano size by using mechanical lithography using an Atomic Force Microscope (AFM). The patterned portion is bent compared to other portions to have high surface potential. When the liquid solution, in which the 2D material flakes 102 are dissolved, is subsequently sprayed, the 2D material flakes 102 exert high bonding interaction with the surface having the high surface potential, so that the present invention may dispose the 2D material flakes 102 in the patterned portion. The second method is a surface-treatment method of forming a polymethyl metacylate (PMMA) layer on a substrate, patterning the PMMA layer by using e-beam lithography, putting self alignment molecules (SAM) on an opened portion, and subsequently, forming the SAM only on a desired portion by removing the PMMA layer. Here, a material easily and strongly bonded to the 2D material is used as the SAM material.

In step S12 of transferring the 2D material 102 by spraying the liquid solution, in which the 2D material flakes 102 are dissolved, on the substrate 100, on which the pattern 101 is formed, the 2D material 102 may be selected from the group consisting of $MoS_2$, $WS_2$, $MoSe_2$, and $WSe_2$, and a solution in which ethanol and water are mixed may be selected as the liquid in which the 2D is dissolved.

The liquid solution in which the 2D material flakes are dissolved may be transferred onto the substrate 100 on which the pattern is formed by the method, such as spraying, and the 2D material flakes 102 are disposed on a surface-treated portion 101 of the substrate as illustrated in FIG. 2 by drying the liquid component.

In step S13 of forming the first electrodes 103 at both sides of the 2D material disposed on the substrate 100, the electrodes are formed at both sides of the 2D material in order to use the 2D material 102 as a channel of the electronic device. An existing metal electrode may be available as the material of the first electrode 103, and graphene, which is a 2D electrode, may also be used. The first electrode 103 may be formed by a lithography method or a deposition method using deposition equipment (for example, an evaporator), which is a general method in this field, or the like.

In step S14 of forming the dielectric layer 104 on the formed first electrodes 103, a material of the dielectric layer may be at least one selected from the group consisting of $HfO_2$, $AlO_3$, and $SiO_2$, and further, in order to manufacture an electronic device, which has a high conductivity change, and is transparent and bendable, the dielectric layer may be formed of 2D materials, such as hexagonal boron nitride (h-BN).

The dielectric layer 104 may be formed between the first electrodes 103 at both sides of the 2D material, and similarly, may be formed by about several tens of nm by a deposition method using deposition equipment (for example, an evaporator), or Atomic Layer Deposition (ALD), which is a general method in this field, or the like.

In step S15 of forming the second electrode 105 on the dielectric layer 104, the second electrode 105 may be formed of the same material as that of the first electrode, and may be formed of a different material.

As described above, the embodiment has been disclosed in the drawings and the specification. The specific terms used herein are for purposes of illustration, and do not limit the scope of the present invention defined in the claims. Accordingly, those skilled in the art will appreciate that various modifications and another equivalent example may be made without departing from the scope and spirit of the present disclosure. Therefore, the sole technical protection scope of the present invention will be defined by the technical spirit of the accompanying claims.

What is claimed is:

1. A method of manufacturing a junction electronic device having a 2-Dimensional (2D) material as a channel, comprising:
    forming a patterned portion by surface-treating a substrate so that the patterned portion has a higher surface potential than other portions of the substrate;
    bonding a 2D material to the patterned portion having the higher surface potential by spraying a liquid including 2D material flakes onto the substrate;
    forming a pair of first electrodes in contact with both ends of the 2D material disposed on the substrate;
    forming a dielectric layer on the first electrodes and the 2D material; and
    forming a second electrode on the dielectric layer.

2. The method of claim 1, wherein the substrate is selected from the group consisting of a silicon substrate, a silicon oxide substrate, and a plastic substrate.

3. The method of claim 1, wherein the 2D material is selected from the group consisting of $MoS_2$, $WS_2$, $MoSe_2$, and $WSe_2$, and the liquid is a mixture of ethanol and water.

4. The method of claim 1, wherein the surface-treating of the substrate includes forming nano sized portions by using mechanical lithography using an Atomic Force Microscope (AFM).

5. The method of claim 1, wherein the first and second electrodes are made of metal or graphene.

6. The method of claim 1, wherein the dielectric layer is formed of one or more materials selected from the group consisting of $HfO_2$, $AlO_3$, and $SiO_2$.

* * * * *